(12) United States Patent
An

(10) Patent No.: US 7,522,467 B2
(45) Date of Patent: Apr. 21, 2009

(54) SEMICONDUCTOR MEMORY DEVICE

(75) Inventor: Yong-Bok An, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 41 days.

(21) Appl. No.: 11/526,830

(22) Filed: Sep. 26, 2006

(65) Prior Publication Data
US 2007/0147148 A1 Jun. 28, 2007

(30) Foreign Application Priority Data
Sep. 29, 2005 (KR) ............... 10-2005-0091551
Mar. 31, 2006 (KR) ............... 10-2006-0029649

(51) Int. Cl.
G11C 8/00 (2006.01)
G11C 7/00 (2006.01)

(52) U.S. Cl. ..................... 365/230.03; 365/230.08; 365/189.05; 365/189.08; 365/194; 365/201

(58) Field of Classification Search ............ 365/189.05, 365/189.08, 194, 201, 230.03, 230.08
See application file for complete search history.

(56) References Cited

U.S. PATENT DOCUMENTS

| 5,544,124 | A |   | 8/1996 | Zagar et al. |
| 5,570,381 | A | * | 10/1996 | Schofield ............... 365/201 |
| 5,706,292 | A | * | 1/1998 | Merritt ................ 365/201 |
| 5,959,911 | A | * | 9/1999 | Krause et al. ............. 365/201 |
| 5,959,929 | A | * | 9/1999 | Cowles et al. ........ 365/230.03 |
| 5,959,936 | A |   | 9/1999 | Seo et al. |
| 6,108,252 | A | * | 8/2000 | Park ................... 365/201 |
| 6,269,031 | B1 |   | 7/2001 | Fukuhara |
| 6,418,068 | B1 | * | 7/2002 | Raynham ............. 365/230.03 |
| 6,446,180 | B2 | * | 9/2002 | Li et al. ............... 365/194 |
| 6,542,416 | B1 |   | 4/2003 | Hampel et al. |
| 2004/0062090 | A1 |   | 4/2004 | Inuzuka et al. |

(Continued)

FOREIGN PATENT DOCUMENTS

JP    2000-137998    5/2000

(Continued)

OTHER PUBLICATIONS

Korean Office Action issued in corresponding Korean Patent Application No. KR 10-2006-0029649, dated Mar. 19, 2007.

(Continued)

*Primary Examiner*—Trong Phan
(74) *Attorney, Agent, or Firm*—McDermott Will & Emery LLP

(57) ABSTRACT

A semiconductor memory device analyzes tRCD inferiority by simultaneously interlock-controlling an enable time of column address and an access time of cell data. The semiconductor memory device includes a bank column address controller for decoding an bank address and a bank control signal to provide a bank column address, and an enable controller for outputting a plurality of control signals with different states in response to a test mode signal, outputting the bank control signal of which enable delay time is controlled by a selective activation state of the plurality of control signals in a read/write operation mode, and controlling a column address enable signal to activate the bank column address to have the same enable delay time as the bank control signal.

25 Claims, 9 Drawing Sheets

U.S. PATENT DOCUMENTS

2005/0138456 A1    6/2005  Song

FOREIGN PATENT DOCUMENTS

| JP | 2000-163951 | 6/2000 |
| JP | 2004-127382 | 4/2004 |
| JP | 2005-182973 | 7/2005 |
| KR | 1997-0029812 | 6/1997 |
| KR | 1998-057449 | 9/1998 |
| KR | 100242720 B1 | 11/1999 |
| KR | 1020010004908 A | 1/2001 |
| KR | 1020050031679 A | 4/2005 |
| KR | 1020050056376 A | 6/2005 |

OTHER PUBLICATIONS

English translation of Taiwanese Office Action issued in Taiwanese Patent Application No. TW 095136284, mailed Dec. 22, 2008.

* cited by examiner

SEMICONDUCTOR MEMORY DEVICE

FIELD OF THE INVENTION

The present invention relates to semiconductor design technologies, and more particularly, to a technique capable of analyzing tRCD inferiority by simultaneously controlling both an enable time of a column address and an access time of cell data.

BACKGROUND

In general, a semiconductor memory device such as Dynamic Random Access Memory (DRAM) is driven by a row address and a column address externally provided. FIG. 1 is a block diagram of a conventional semiconductor memory device.

The conventional semiconductor memory device includes a global column address controller 10, a clock controller 20, a bank column address controller 30, a command controller 40, a column address enable controller 50 and a Column Address (CA) latch unit 60.

The global column address controller 10 is provided with an address (ADD) pad 11, an ADD buffer 12, an ADD latch 13, an ADD selector 14, an Additive Latency (AL) shift register 15, a CA selector 16, and a CL shift (CL+1(+3) shift register 17.

The clock controller 20 is provided with a clock (CK/CKB) pad 21 and a clock (CLK/CLKB) buffer 22.

The bank column address controller 30 is equipped with a Bank Address (BA) pad 31, an ADD buffer 32, an ADD latch 33, an ADD selector 34, an AL shift register 35, a CL shift (CL+1(+3) shift register 36, a CA selector 37, and a BA decoder 38.

The command controller 40 is composed of a command (CMD) pad 41, a CMD buffer 42, a CMD latch 43, a CMD decoder 44, AL shift registers 45 and 46, and a CL shift register 47. The column address enable controller 50 is provided with a column address enable (YAE) signal generator 51, a YAE signal delay unit 52, and a YAE signal decoder 53. The CA latch unit 60 is provided with a CA latch 61.

FIG. 2 is a detailed circuit diagram of the BA decoder 38 shown in FIG. 1.

The BA decoder 38 is composed of a plurality of inverters IV1 to IV6 and a plurality of NAND gates ND1 to ND4 to logically multiply signals input thereto. As illustrated, the BA decoder 38 is applied to a semiconductor memory device having a 4-bank structure.

More specifically, the NAND gate ND1 NAND-operates a bank address BA0 inverted by the inverter IV1 and a bank address BA1 inverted by the inverter IV2. The NAND gate ND2 NAND-operates the bank address BA0 and the bank address BA1 inverted by the inverter IV2. The NAND gate ND3 NAND-operates the bank address BA0 inverted by the inverter IV1 and the bank address BA1. The NAND gate ND4 NAND-operates the bank addresses BA0 and BA1.

The inverter IV3 inverts an output of the NAND gate ND1 to provide a bank column address CBA<0>. The inverter IV4 inverts an output of the NAND gate ND2 to output a bank column address CBA<1>. The inverter IV5 inverts an output of the NAND gate ND3 to provide a bank column address CBA<2>. The inverter IV6 inverts an output of the NAND gate ND4 to provide a bank column address CBA<3>.

The following is an operation description of the conventional semiconductor memory device having the configuration as mentioned above, which is made with reference to an operation timing diagram shown in FIG. 3. In the operation timing diagram of FIG. 3, it is assumed that in Double Data Rate Two Synchronous DRAM (DDR2 SDRAM) AL is "2," CL is "6" and Burst Length (BL) is "4."

The column address is controlled by the global column address controller 10 and the bank column address controller 30. The global column address controller 10 serves to control a global column address for each bank to access (read or write) data of a sense amplifier. The bank column address controller 30 is to control a bank column address having information of a bank to be selected. Here, the bank column address implies a column address enable signal to latch the bank selected according to the global column address.

Each column address is generated in an identical sequence under the control of the clock controller 20 and the command controller 40. The clock buffer 22 buffers clocks (CLK and CLKB) provided from the clock pad 21 to provide the same as an overall synchronizing signal within a chip.

An address applied to the ADD pad 11 is fed to the ADD latch 13 via the ADD buffer 12. A bank address at the BA pad 31 is delivered to the ADD latch 33 via the ADD buffer 32. At this time, the ADD latches 13 and 33, as shown in A(A') of FIG. 3, outputs the addresses to the ADD selectors 14 and 34 in synchronism with a falling edge of a clock CLK provided from the clock buffer 22, respectively.

Thereafter, when a write command WT or read command RD is applied to the CMD pad 41, it is delivered to the ADD selectors 14 and 34, in which the column addresses are queued, in synchronism with the falling edge of the clock CLK, as in the address.

Further, as depicted in B(B') of FIG. 3, a signal is output to the AL shift registers 15 and 35 to perform the AL and CL functions depending on Mode Register Set (MRS) that is set by latching the column address.

At this time, Read Latency (RL) becomes AL+CL and Write Latency (WL) becomes RL-1 in DDR2 spec, which leads to AL+CL-1. In the read mode, the column address is shifted by the clock number of AL value, as in D(D') of FIG. 3, and the clock corresponding to CL value is shifted by the CL clock number in a block that outputs data to a DQ pad.

When the read command is input, a read command signal RDP is output through the CMD decoder 44 followed by the same AL shift register 45 as in the column address. The column addresses through the AL shift registers 15 and 35 are applied to the CA selectors 16 and 37, which take the read command signal RDP and provide read column addresses, as in E(E') of FIG. 3.

On the other hand, in the write mode, the column address is shifted by WL and further shifted by BL/2. The DDR2 is characterized by 4-bit pre-fetch. Here, in order to perform the 4-bit pre-fetch, 2-clock is required where BL=4 and 4-clock where BL=8, by conducting the fetch at the rising edge and falling edge of every clock.

In the write mode, data is input after WL, and therefore, more time is needed to fetch the data in order to make the data internally aligned. By further shifting the data by that time, the write column address can be synchronized with the data on the Global Input/Output (GIO) bus at the same timing. Accordingly, the write column address, as in D(D') of FIG. 3, is shifted by AL+CL+1 where BL=4 (2-clock) and AL+CL+3 where BL=8 (4-clock).

The write command is shifted by the same clock number via the CMD decoder 44 to output the write command signal WTP. The write command signal WTP of the CMD decoder 44 is then applied to the CA selectors 16 and 37 to provide write column addresses, as in E(E') of FIG. 3.

Among the output addresses, the column address as in E of FIG. 3 is globally delivered to all banks; and the bank column address as in E' of FIG. 3 is decoded by the BA decoder 38 and a signal as in CBA of FIG. 3 is then output to only a selected bank. The output signal CBA of the BA decoder 38 is latched by the CA latch 60 and then delivered to the selected bank.

Meanwhile, the YAE signal generator 51 combines the read command signal RDP, the write command signal WTP and the CAS signal ICASP (where BL=8). And the YAE signal delay unit 52 delays an output signal of the YAE signal generator 51 for a certain time. The YAE signal decoder 53 decodes a bank information signal BBY<0:3> and an output signal of the YAE signal delay unit 52 to provide a column address enable signal YAE<0:3> to the selected bank.

At this time, during the write operation in the selected bank, the data transferred from the GIO bus is stored in a corresponding cell according to an enable of a write driver (WTDRV). During the read operation in the selected bank, a developed signal of data transferred through local input/output buses SIO and LIO is amplified in a bit line sense amp depending on an enable of an Input/Output Sense Amp (IOSA) and then fed to the GIO bus. Thus, it is required to maintain a constant interval with the column address in order to secure a margin during the write and read operations. For this, the YAE signal delay unit 52 delays the column address enable signal YAE for a certain time.

The column address is delivered after the row address is provided to the bank together with an active command. This elapsed time is defined as tRCD [Row Address Strobe (RAS) to CAS Delay], which may be 15 ns as 6-clock where CL=6. This means time that the data of the sense amp can be accessed by the column address after the word line is enabled by the row address and thus the sense amp is sufficiently operated. Such tRCD time is used as an index to determine the performance, wherein the performance is judged to be excellent as it is shorter.

Therefore, there is no problem if tRCD margin is sufficient, but there is problem in delaying the externally applied column address if it is deficient.

In addition, there is a recent trend to require low latency products with tRCD decreased by 1 clock in comparison with the spec. Accordingly, although there is tRCD margin in the spec, lack of margin may happen due to operation under such tRCD state decreased by 1 clock.

SUMMARY OF THE INVENTION

It is, therefore, an object of the present invention to provide a semiconductor memory device capable of analyzing tRCD inferiority by simultaneously controlling both an enable time of column address and an access time of cell data.

In accordance with one aspect of the present invention, there is provided a semiconductor memory device including: a bank column address controller for decoding an bank address and a bank control signal to provide a bank column address; and an enable controller for outputting a plurality of control signals with different states in response to a test mode signal, outputting the bank control signal of which enable delay time is controlled by a selective activation state of the plurality of control signals in a read/write operation mode, and controlling a column address enable signal to activate the bank column address to have the same enable delay time as the bank control signal.

In accordance with another aspect of the present invention, there is provided a semiconductor memory device including: a bank column address controller for decoding an bank address and a bank control signal to provide a bank column address; an enable controller for outputting a plurality of control signals with different states in response to a test mode signal, outputting the bank control signal of which enable delay time is controlled by a selective activation state of the plurality of control signals, and controlling the access enable time of cell data to have the same delay time as the bank control signal; and a bank for controlling an access operation of the cell data depending on the bank column address in a read/write operation mode.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, preferred embodiments of the present invention will be set forth in detail with reference to the accompanying drawings.

Figure 1:
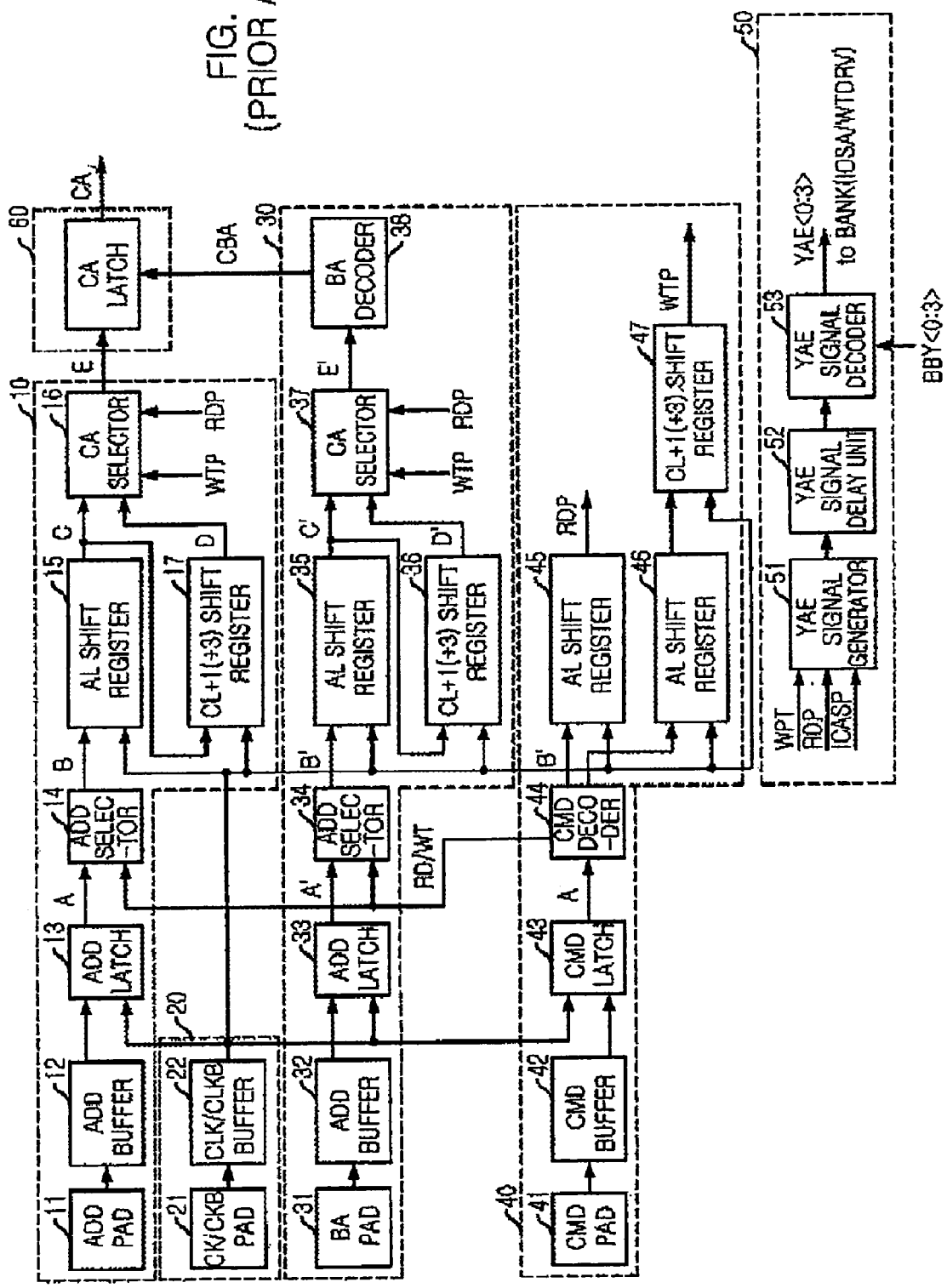
FIG. 1 is a block diagram of a conventional semiconductor memory device.
Figure 2:
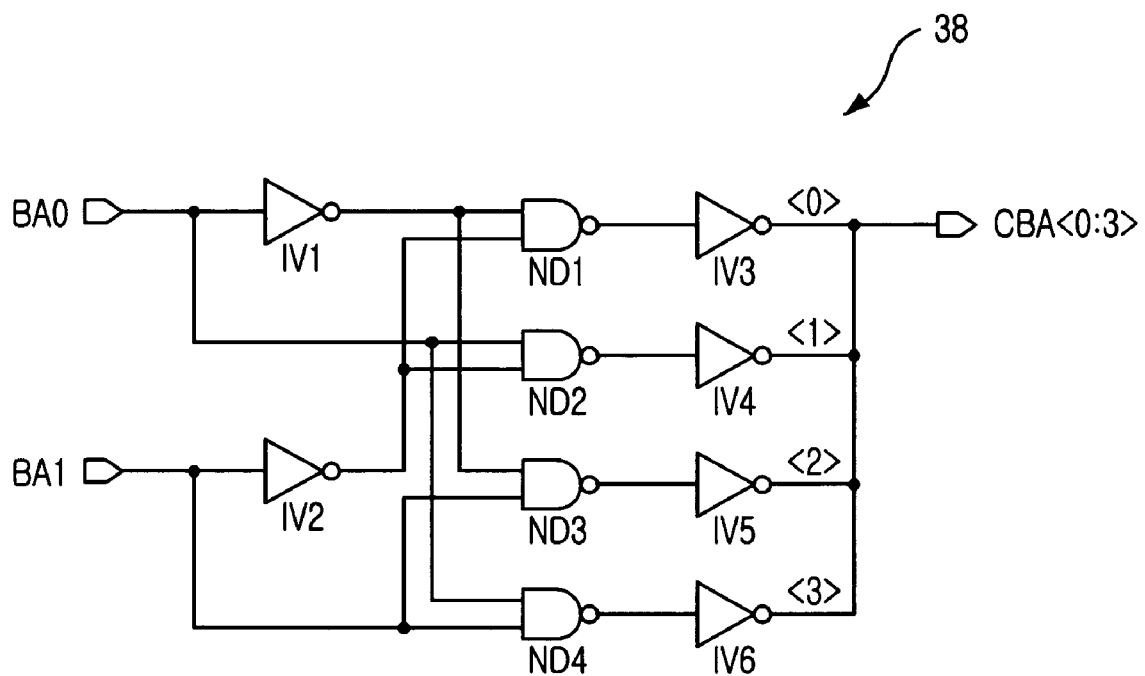
FIG. 2 is a detailed circuit diagram of the BA decoder shown in FIG. 1.
Figure 3:
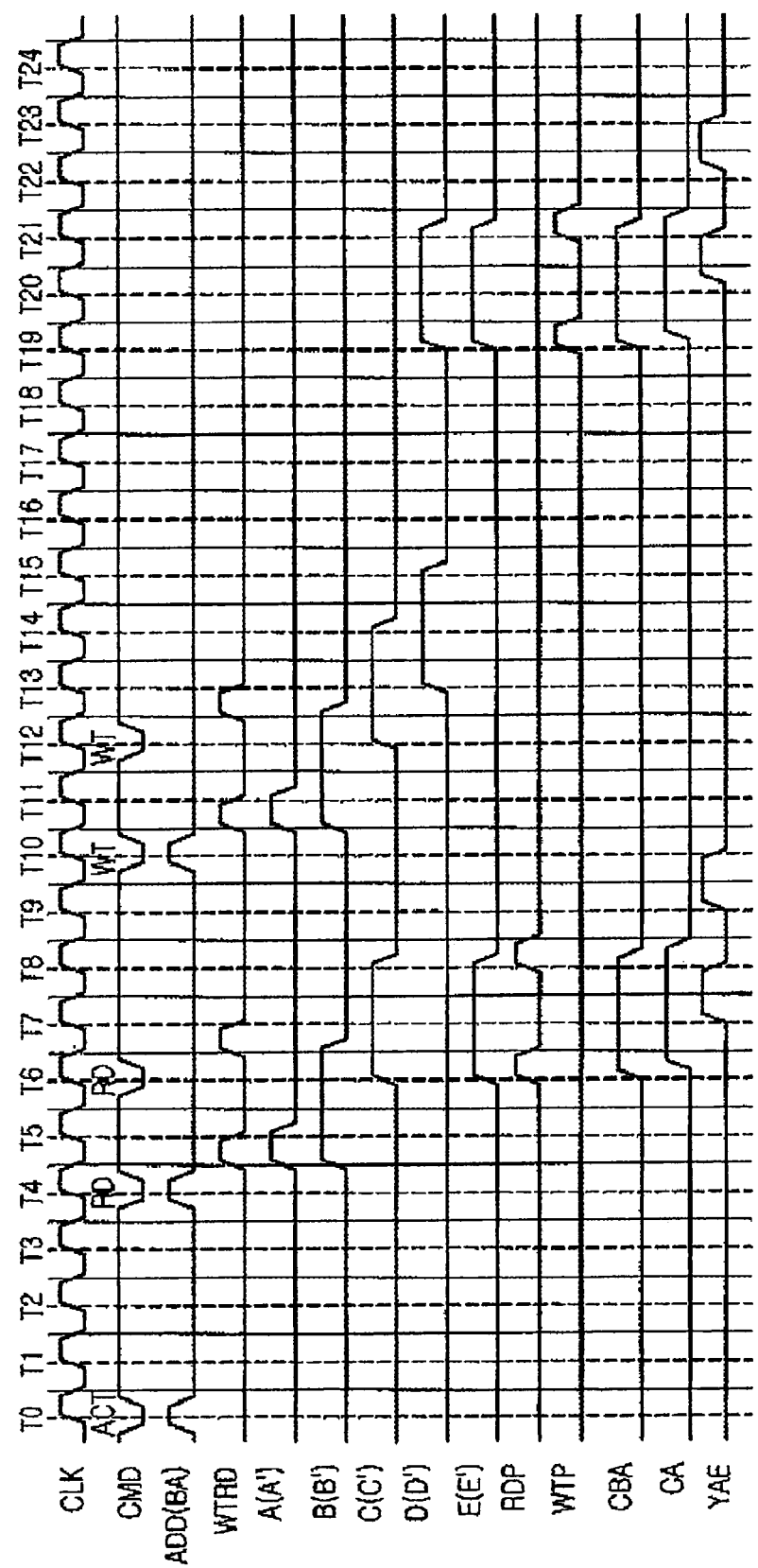
FIG. 3 is an operation timing diagram of the conventional semiconductor memory device.
Figure 4:
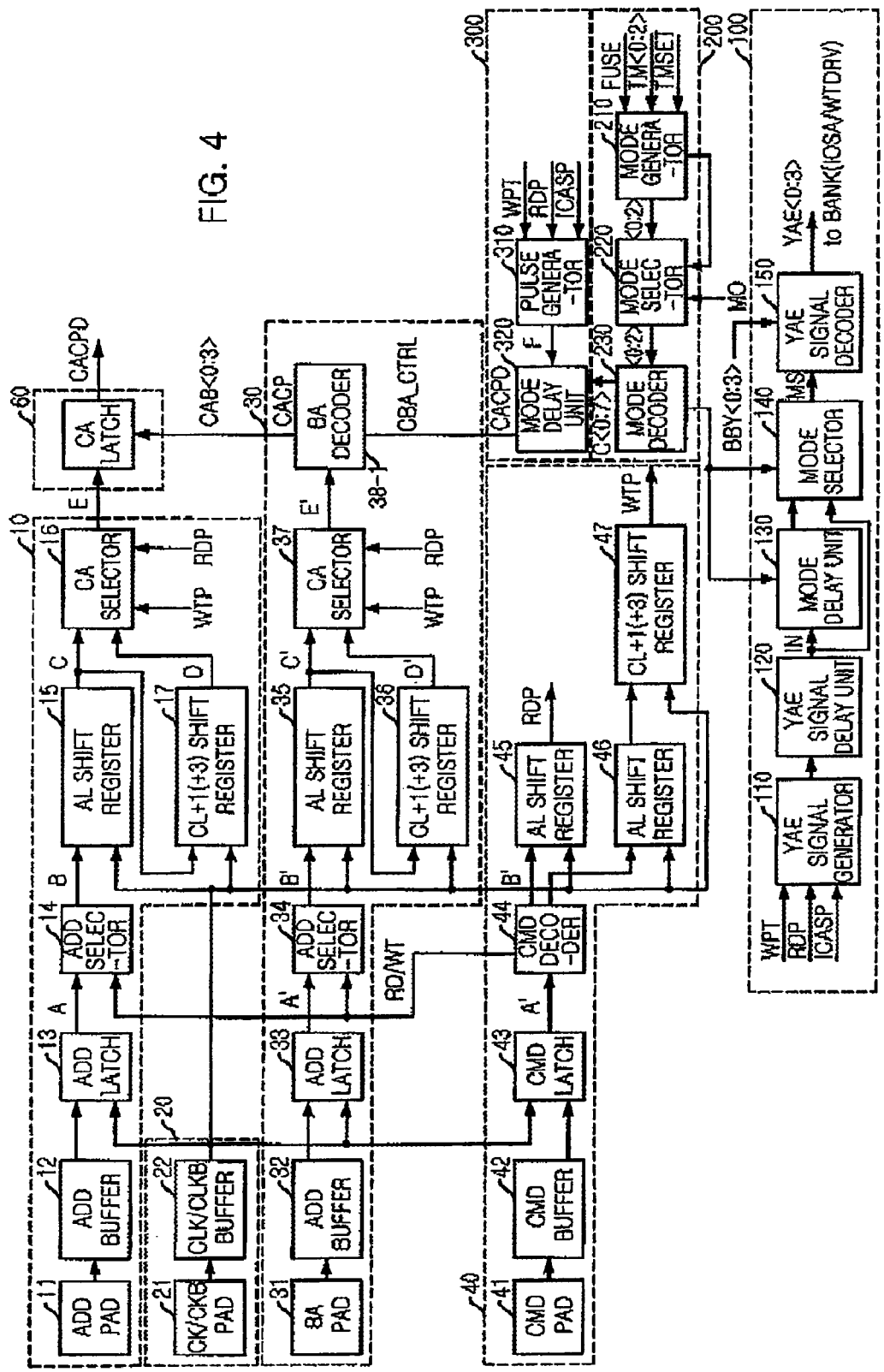
FIG. 4 is a block diagram of a configuration of a semiconductor memory device in accordance with a preferred embodiment of the present invention.

FIG. 4 is a block diagram of a semiconductor memory device in accordance with a preferred embodiment of the present invention.

The semiconductor memory device of the present invention includes a global column address controller 10, a clock controller 20, a bank column address controller 30, a command controller 40, a column address latch 60, a column address enable controller 100, a mode controller 200, and a control signal generator 300. In the following embodiments, like reference numerals identify like elements and a construction and operation description of like elements will be omitted.

The column address enable controller 100 is provided with a YAE signal generator 110, a YAE signal delay unit 120, a mode delay unit 130, a mode selector 140, and a YAE signal decoder 150.

The mode controller 200 is provided with a mode generator 210, a mode selector 220 and a mode decoder 230. And the control signal generator 300 is provided with a pulse generator 310 and a mode delay unit 320.

Figure 5:
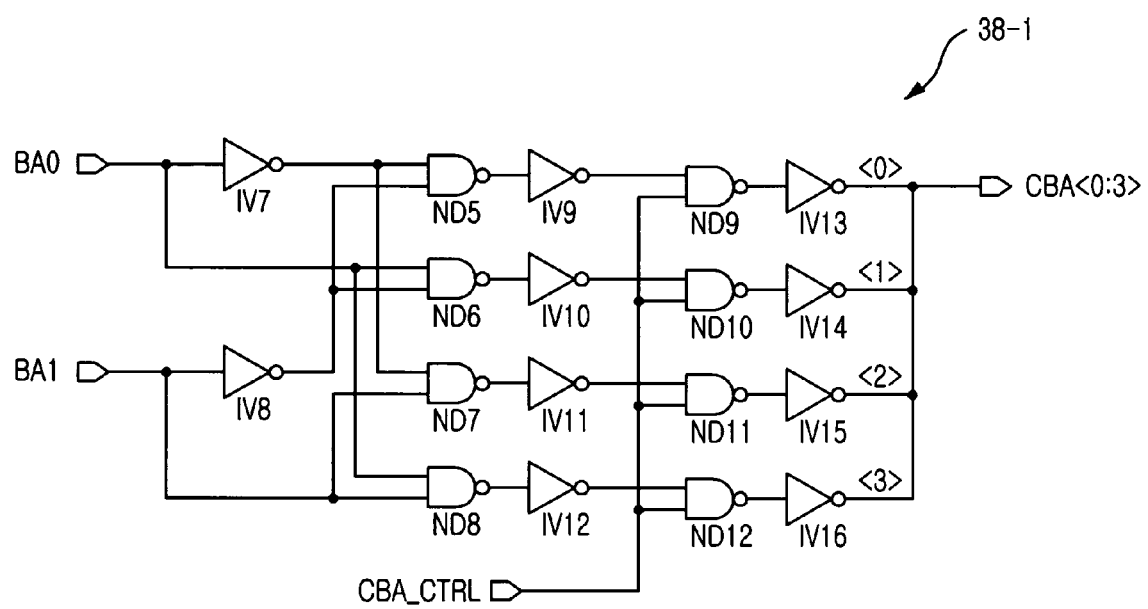
FIG. 5 is a detailed circuit diagram of the BA decoder shown in FIG. 4.

FIG. 5 is a detailed circuit diagram of the BA decoder 38-1 shown in FIG. 4.

As shown therein, the BA decoder 38-1 is composed of a plurality of inverters IV7 to IV16 and a plurality of NAND gates ND5 to ND12. Here, it is illustrated that the BA decoder 38-1 is applied to a semiconductor memory device having a 4-bank structure.

More specifically, the NAND gate ND5 NAND-operates a bank address BA0 inverted by the inverter IV7 and a bank address BA1 inverted by the inverter IV8. The NAND gate ND6 NAND-operates the bank address BA0 and the bank address BA1 inverted by the inverter IV8. The NAND gate ND7 NAND-operates the bank address BA0 inverted by the inverter IV7 and the bank address BA1. The NAND gate ND8 NAND-operates the bank addresses BA0 and BA1.

In succession, the NAND gate ND9 NAND-operates an output of the inverter IV9 following the NAND gate ND5 and a control signal CBA_CTRL. The NAND gate ND10 NAND-operates an output of the inverter IV10 following the NAND gate ND6 and the control signal CBA_CTRL. The NAND gate ND11 NAND-operates an output of the inverter IV11 following the NAND gate ND7 and the control signal CBA_CTRL. The NAND gate ND12 NAND-operates an output of the inverter IV12 following the NAND gate ND8 and the control signal CBA_CTRL.

The inverter IV13 inverts an output of the NAND gate ND9 to provide a bank column address CBA<0>. The inverter IV14 inverts an output of the NAND gate ND10 to output a bank column address CBA<1>. The inverter IV15 inverts an output of the NAND gate ND11 to provide a bank column address CBA<2>. The inverter IV16 inverts an output of the NAND gate ND12 to provide a bank column address CBA<3>.

Figure 6:
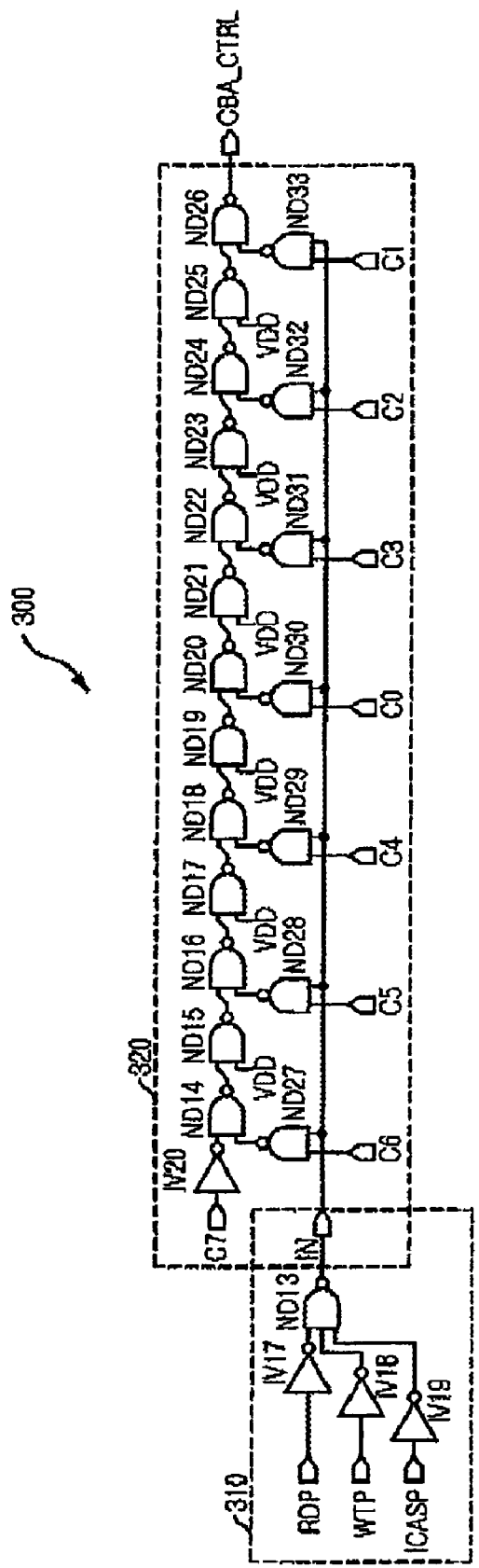
FIG. 6 is a detailed circuit diagram of the pulse generator and the mode delay unit shown in FIG. 4.

FIG. 6 is a detailed circuit diagram of the pulse generator 310 and the mode delay unit 320 shown in FIG. 4.

The pulse generator 310 is provided with inverters IV17 to IV19 and an NAND gate ND13. Here, the NAND gate ND13 NAND-operates a read command signal RDP inverted by the inverter IV17, a write command signal WTP inverted by the inverter IV18 and a CAS signal ICASP inverted by the inverter IV19.

The mode delay circuit 320 is provided with an inverter IV20, a plurality of NAND gates ND14 to ND26 connected in series and a plurality of NAND gates ND27 to ND33 connected in parallel. Here, the inverter IV20 inverts a control signal C7.

The plurality of NAND gates ND27 to ND33 connected in parallel NAND-operates control signals C6 to C1 and an output of the NAND gate ND13 to provide their outputs to odd NAND gates out of the NAND gates ND14 to ND26, respectively. The plurality of NAND gates ND14 to ND26 connected in series NAND-operates outputs of their respective previous NAND gates and a power supply voltage VDD or outputs of the NAND gates ND27 to ND33 to provide a control signal CBA_CTRL.

Figure 7:
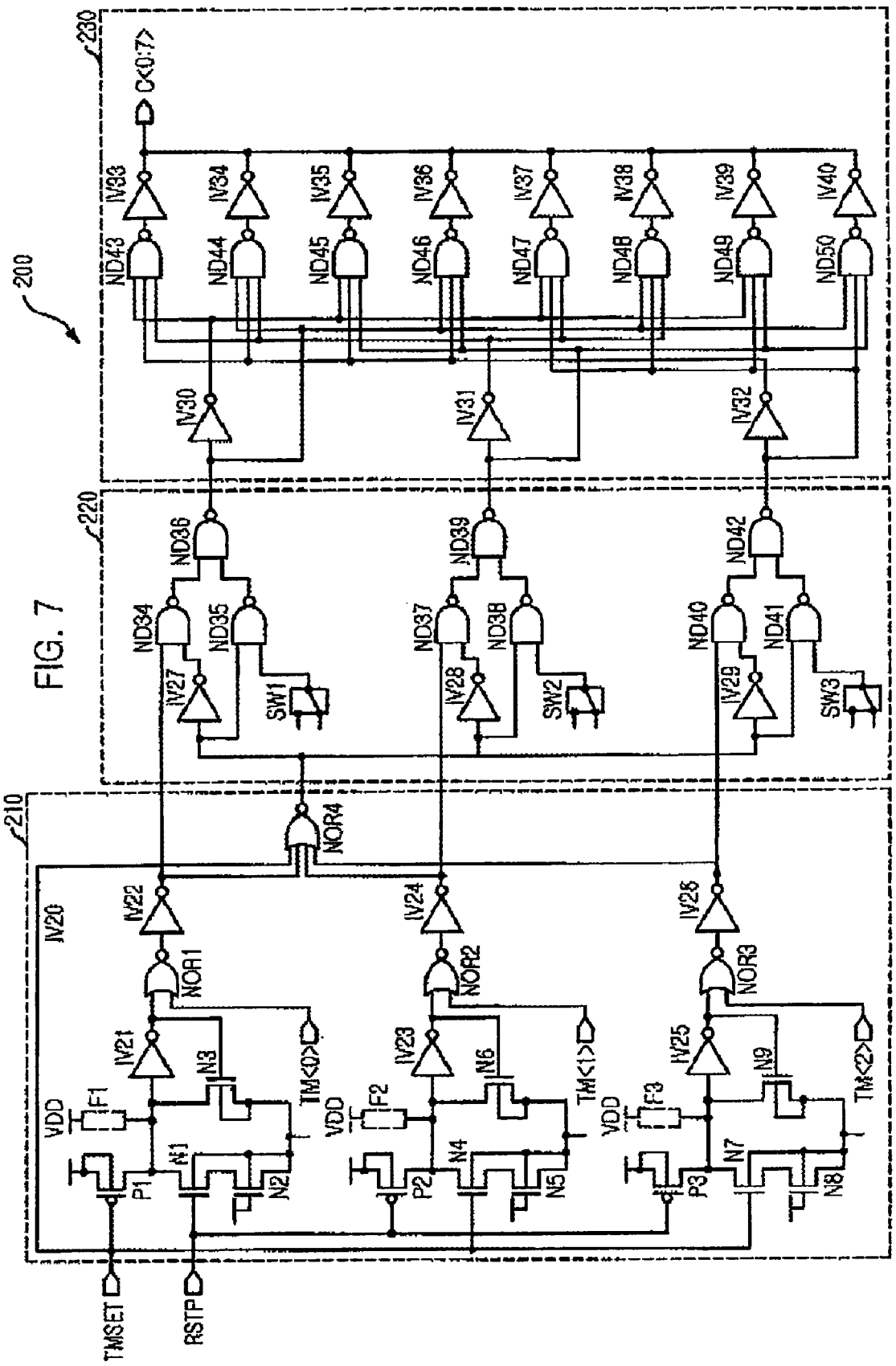
FIG. 7 is a detailed circuit diagram of the mode controller shown in FIG. 4.

FIG. 7 is a detailed circuit diagram of the mode controller 200 shown in FIG. 4.

The mode generator 210 is provided with PMOS transistors P1 to P3, NMOS transistors N1 to N9, fuses F1 to F3, inverters IV21 to IV26, and NOR gates NOR1 to NOR4.

The PMOS transistor P1 and the NMOS transistors N1 and N2 are connected in series between a power supply voltage end VDD and a ground voltage end. The PMOS transistor P1 receives a test mode setting signal TMSET via its gate terminal, the NMOS transistor N1 receives a reset signal RSTP via its gate terminal, and the NMOS transistor N2 receives the power supply voltage via its gate terminal.

The fuse F1 and the NMOS transistor N3 are connected in series between the power supply voltage end and the ground voltage end and the NMOS transistor N3 receives an output of the inverter IV21 via its gate terminal. The NOR gate NOR1 NOR-operates the output of inverter IV21 and a test signal TM<0> and the inverter IV22 inverts an output of the NOR gate NOR1.

Similarly, the PMOS transistor P2 and the NMOS transistors N4 and N5 are connected in series between the power supply voltage end and the ground voltage end. The PMOS transistor P2 receives the reset signal RSTP via its gate terminal, the NMOS transistor N4 receives the test mode setting signal TMSET via its gate terminal, and the NMOS transistor N5 receives the power supply voltage via its gate terminal.

The fuse F2 and the NMOS transistor N6 are connected in series between the power supply voltage end and the ground voltage end and the NMOS transistor N6 receives an output of the inverter IV23 via its gate terminal. The NOR gate NOR2 NOR-operates the output of inverter IV23 and a test signal TM<1> and the inverter IV24 inverts an output of the NOR gate NOR2.

Likewise, the PMOS transistor P3 and the NMOS transistors N7 and N8 are connected in series between the power supply voltage end and the ground voltage end. The PMOS transistor P3 receives the reset signal RSTP via its gate terminal, the NMOS transistor N7 receives the test mode setting signal TMSET via its gate terminal, and the NMOS transistor N8 accepts the power supply voltage via its gate terminal.

The fuse F3 and the NMOS transistor N9 are connected in series between the power supply voltage end and the ground voltage end and the NMOS transistor N9 receives an output of the inverter IV25 via its gate terminal. The NOR gate NOR3 NOR-operates the output of inverter IV25 and a test signal TM<2> and the inverter IV26 inverts an output of the NOR gate NOR3. And the NOR gate NOR4 NOR-operates the outputs of inverters IV22, IV24 and IV26 and the test mode setting signal TMSET.

The mode selector 220 is provided with inverts IV27 to IV29, NAND gates ND34 to ND42, and switches SW1 to SW3 of which switching operations are controlled depending on a metal option M0.

The NAND gate ND34 NAND-operates an output of the inverter IV27 following the NOR gate NOR4 and an output of the inverter IV22. The NAND gate ND35 NAND-operates an output of the switch SW1 and the output of the NOR gate NOR4. The NAND gate ND36 NAND-operates outputs of the NAND gates ND34 and ND35.

Similarly, the NAND gate ND37 NAND-operates an output of the inverter IV24 and an output of the inverter IV28 following the NOR gate NOR4. The NAND gate ND38 NAND-operates an output of the switch SW2 and the output of the NOR gate NOR4. The NAND gate ND39 NAND-operates outputs of the NAND gates ND37 and ND38.

In the same manner, the NAND gate ND40 NAND-operates an output of the inverter IV26 and an output of the inverter IV29 following the NOR gate NOR4. The NAND gate ND4l NAND-operates the output of the switch SW3 and an output of the NOR gate NOR4. The NAND gate ND42 NAND-operates outputs of the NAND gates ND40 and ND41.

In succession, the mode decoder 230 is provided with a plurality of inverters IV30 to IV40 and a plurality of NAND gates ND43 to ND50. The NAND gate ND43 NAND-operates outputs of the inverters IV30 to IV32. The NAND gate ND44 NAND-operates an output of the NAND gate ND36 and outputs of the inverters IV31 and IV32. The NAND gate ND45 NAND-operates outputs of the inverters IV30 and IV32 and an output of the NAND gate ND39. The NAND gate ND46 NAND-operates outputs of the NAND gates ND36 and ND39 and an output of the inverter IV32.

The NAND gate ND47 NAND-operates outputs of the inverters IV30 to IV31 and an output of the NAND gate ND42. The NAND gate ND48 NAND-operates outputs of the NAND gates ND36 and ND42 and an output of the inverter IV31. The NAND gate ND49 NAND-operates an output of the inverter IV30 and outputs of the NAND gates ND39 and ND42. The NAND gate ND50 NAND-operates outputs of the NAND gates ND36, ND39 and ND42.

The inverter IV33 inverts an output of the NAND gate ND43 to output a control signal C<0>, the inverter IV34 inverts an output of the NAND gate ND44 to output a control signal C<1>, the inverter IV35 inverts an output of the NAND gate ND45 to output a control signal C<2>, the inverter IV36 inverts an output of the NAND gate ND46 to output a control signal C<3>, and the inverter IV37 inverts an output of the NAND gate ND47 to output a control signal C<4>. The inverter IV38 inverts an output of the NAND gate ND48 to output a control signal C<5>, the inverter IV39 inverts an output of the NAND gate ND49 to output a control signal C<6>, and the inverter IV40 inverts an output of the NAND gate ND50 to output a control signal C<7>.

Figure 8:
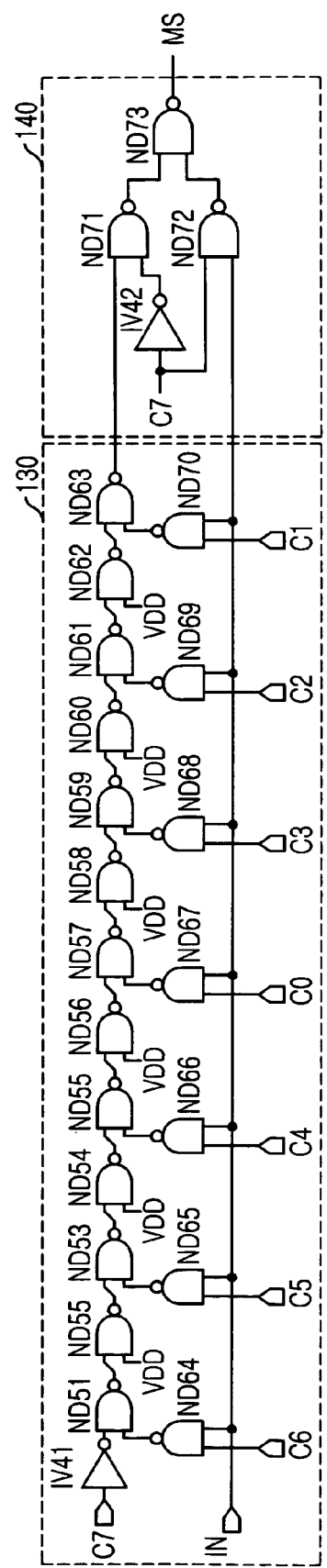
FIG. 8 is a detailed circuit diagram of the mode delay unit and the mode selector shown in FIG. 4.

FIG. 8 illustrates a detailed circuit diagram of the mode delay unit 130 and the mode selector 140 shown in FIG. 4.

As shown therein, the mode delay unit 130 is provided with an inverter IV41, a plurality of NAND gates ND51 to ND63 connected in series and a plurality of NAND gates ND64 to ND70 connected in parallel. The inverter IV41 inverts the control signal C7.

The plurality of NAND gates ND64 to ND70 connected in parallel NAND-operates control signals C6 to C1 and an output IN of the YAE signal delay unit 120 to provide their outputs to odd NAND gates out of the NAND gates ND51 to ND63, respectively. The plurality of NAND gates ND51 to ND63 connected in series NAND-operates outputs of their respective previous NAND gates and the power supply voltage or outputs of the NAND gates ND64 to ND70.

Subsequently, the mode selector 140 is provided with an inverter IV42 and NAND gates ND71 to ND73. Here, the NAND gate ND71 NAND-operates an output of the NAND gate ND63 and a control signal C7 inverted by the inverter IV42. The NAND gate ND72 NAND-operates the control signal C7 and the output IN of the YAE signal delay unit 120. The NAND gate ND73 NAND-operates outputs of the NAND gates ND71 and ND72 to provide a mode selection signal MS to the next YAE signal decoder 150. The YAE signal decoder 150 decodes the MS and a bank information sianal BBY<0:3> to provide a colunm address enable signal YAE<0:3> to the selected bank.

Figure 9:
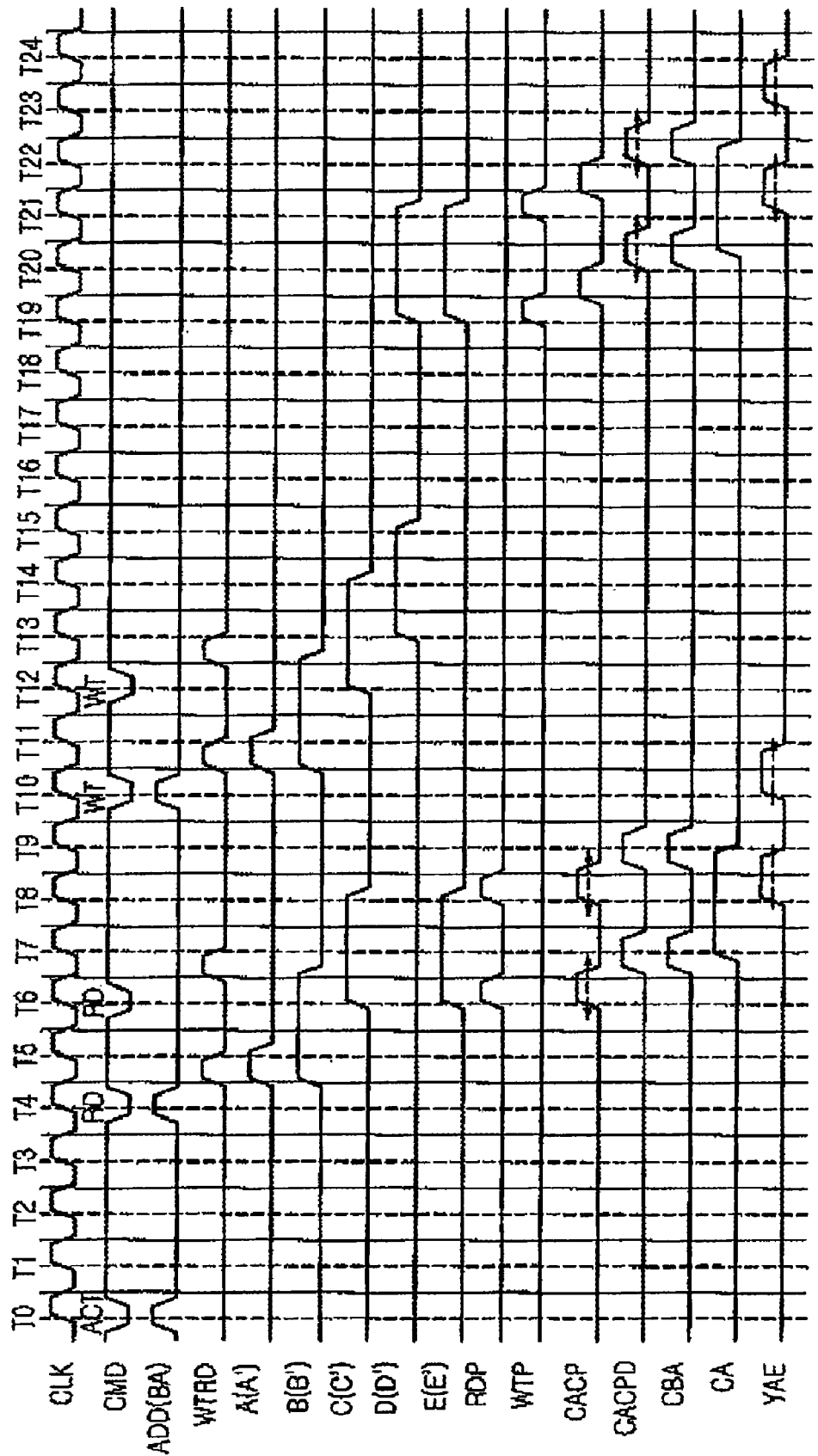
FIG. 9 is an operation timing diagram of the semiconductor memory device in accordance with the present invention.

A detailed operation procedure of the present invention having the configuration as above will be described with reference to an operation timing diagram shown in FIG. 9.

First, the pulse controller 310 NAND-operates the read command signal RDP, the write command signal WTP and the internal CAS signal ICASP to provide an output signal to the mode delay unit 320. The mode controller 200 makes a mode selection depending on a metal option, a fuse option or a test mode option.

Then, the mode generator 210 provides a low level signal by connecting the fuse F1 to the power supply voltage end under the normal state that the fuse F1 is not cut. In contrast, a final output of the mode generator 210 becomes a high level by making a connection node of the fuse F1 maintained at a low level by a latch composed of the inverter IV21 and the NMOS transistor N3 when the fuse F1 is cut.

There may be a floating state wherein the PMOS transistor P1 and the NMOS transistor N1 connected at the same node are all disabled. Thus, at the moment of the power-up operation, the reset signal RSTP for initialization is applied as a pulse signal to the gate terminal of the NMOS transistor N1. In response thereto, the node to which the fuse F1 is connected is controlled to be a low level during the initialization operation, thereby rendering the output of the latch composed of the inverter IV21 and the NMOS transistor N3 maintained at a high level.

That is, if the fuse F1 is not cut, the output of the inverter IV21 becomes logic low, and if the fuse F1 is cut, the output of the inverter IV21 becomes logic high. At this time, if the test mode setting signal TMSET is activated, the PMOS transistor P1 becomes turned on. Based on this, upon initialization, the fuse F1 becomes cut and thus the output of the inverter IV21 is maintained to be a low level even when the output of the latch (composed of the inverter IV21 and the NMOS transistor N3) is kept to be a high level.

Therefore, if the test mode setting signal TMSET is input, the fuse F1 is under the state that is not cut although it is actually cut. Further, if the test signal TM<0:2> that is another test mode signal is input, the output value is decided based on it.

Thereafter, the mode selector 220 selects one of the output of the switch SW1 by the metal option and the output of the mode generator 210.

Under the normal state that the fuse F1 is not cut and the test mode setting signal TMSET is inactivated, the output of the mode generator 210 becomes logic low. In this case, the output of the switch SW1 decided by the metal option becomes the power supply voltage or ground voltage level and then provided to the mode decoder 230. At this time, the metal option can be set by proceeding with revision.

In contrast, if the fuse F1 is cut or the test signal TM<0:2> is input depending on the test mode setting signal TMSET, the value by the metal option is neglected and the value by the fuse F1 or test signal TM<0:2> is output to the mode decoder 230. At this time, in case of selecting the metal option, fuse and test mode, it is preferable to decide them in the order of test mode, fuse and metal option.

In succession, the mode decoder 230 decodes the output of the mode selector 220 to output the control signal C<0:7> to each of the mode delay unit 320 to control the bank column address and the mode delay unit 130 to decide the activation time of the column address enable signal.

Next, the mode delay unit 320 allows the rising time and falling time of a signal delayed by the delay block composed of NAND to NAND gate to have same characteristics. Thus, the number of NAND gates enabled in the mode delay unit 320 is varied depending on the control signal C<0:7> decoded by the mode decoder 230. Based on this, the delay value is varied.

The amount of delay is varied with the delay width to length ratio of the NAND gate. With regard to the delay variation rate, the NAND gate delay passes 4-stage if the control signal C0 that is the default value is enabled, and is decreased step by step if the control signals are enabled in the order of C3, C2 and C1. On the contrary, if the control signals are enabled in the order of C4, C5 and C6, the delay is increased step by step.

The delay variation amount of the column address and the column address enable signal YAE according to the output of the mode decoder 230 is shown in Table 1 below.

TABLE 1

| TM2, F3, SW3 | TM1, F2, SW2 | TM0, F1, SW1 | Control signal C | Delay variation rate |
|---|---|---|---|---|
| 0 | 0 | 0 | C0 | Default |
| 0 | 0 | 1 | C1 | Decreased by 3-step |
| 0 | 1 | 0 | C2 | Decreased by 2-step |
| 0 | 1 | 1 | C3 | Decreased by 1-step |

TABLE 1-continued

| TM2, F3, SW3 | TM1, F2, SW2 | TM0, F1, SW1 | Control signal C | Delay variation rate |
|---|---|---|---|---|
| 1 | 0 | 0 | C4 | Increased by 1-step |
| 1 | 0 | 1 | C5 | Increased by 2-step |
| 1 | 1 | 0 | C6 | Increased by 3-step |
| 1 | 1 | 1 | C7 | 0 |

Thereafter, the bank control signal CBA_CTRL with the variation rate of enable time is provided to the BA decoder 38-1. The BA decoder 38-1 decodes the bank addresses BA0 and BA1 and again decodes the decoded signal and the bank control signal CBA_CTRL to output the bank column address CBA<3> and Column Address Control Pulse (CACP) to the column address latch 60. Then, the column address latch 60 latches the bank column address CBA<3> and outputs it in the shape of pulse, as in F of FIG. 9.

If the control signal C7 is enabled, the bank control signal CBA_CTRL that is the output of the mode decoder 320 is fixed to be logic high so that the decoder following the BA decoder 38-1 becomes the stand-by state. Accordingly, the primary decoding result of the bank column address can be output to the bank as it is.

The mode delay unit 130 is also operated in the same manner as the mode delay unit 320. If the control signal C7 is enabled, the output of the mode delay unit 130 becomes logic low. Then, the logic low is applied to the mode selector 140, and thus, the output of the NAND gate ND71 becomes logic high. Based on the output of the NAND gate ND71, its output is decided.

At this time, since the input signal of the NAND gate ND72 is just the output IN of the YAE signal delay unit 120, the mode selection signal MS that is the output of the NAND gate ND73 has the same shape as the bank column address. Accordingly, the bank column address and the column address enable signal YAE can be controlled simultaneously by increasing or decreasing their enable time.

The bank column address and the column address enable signal YAE according to the present invention can be controlled in the same way depending on the metal option, fuse cutting or test mode. Further, it is possible to again change tRCD time by cutting fuse even when tRCD margin is bad due to effects such as environments upon the test, under the state that the timing of the bank column address and the column address enable signal is increased or decreased by proceeding with revision according to a change of tRCD on the basis of characteristics of chip.

Furthermore, if packaging of the chip is in progress, it is also possible to analyze tRCD inferiority by changing the enable timing of the bank column address and the column address enable signal YAE using the test mode.

As set forth above, the present invention can enable inferiority analysis and also improve yield by setting the enable signal of the column address as an optimal value by its change if the timing margin of tRCD is sufficient or deficient within the chip, in forming DRAM or semiconductor device.

The present application contains subject matter related to Korean patent application Nos. 2005-91551 and 2006-29649, filed with the Korean Intellectual Property Office on Sep. 29, 2005 and Mar. 31, 2006, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
    a bank column address controller for decoding a bank address and a bank control signal to provide a bank column addresses; and
    an enable controller for outputting a plurality of control signals with different states in response to a test mode signal, outputting the bank control signal of which enable delay time is controlled by a selective activation state of the plurality of control signals in a read/write operation mode, and controlling a column address enable signal to activate the bank column address to have enable delay time the same as the bank control signal.

2. The semiconductor memory device as recited in claim 1, wherein the enable controller includes:
    a mode controller for selectively activating the plurality of control signals with different states in response to the test mode signal;
    a control signal generator for receiving a pulse signal generated in response to a read/write command signal and delaying the pulse signal for a predetermined time depending on a selective activation of the plurality of control signals to output the bank control signal; and
    a column address enable controller for delaying the column address enable signal generated in response to the read/write command signal for a predetermined time depending on a selective activation of the plurality of control signals.

3. The semiconductor memory device as recited in claim 2, wherein the test mode signal includes at least one of a metal option, a fuse signal and a test signal.

4. The semiconductor memory device as recited in claim 3, wherein the test mode signal is decided in an order of the test signal, the fuse signal, and the metal option.

5. The semiconductor memory device as recited in claim 2, wherein the mode controller includes:
    a mode generator for outputting a signal with different states depending on a cutting state of a fuse, wherein a logic level of the output signal is decided based on a state of the test signal, regardless of the cutting state of the fuse, upon activation of the test mode setting signal;
    a first mode selector for selectively outputting one of an output of the mode generator and a signal by a metal option; and
    a mode decoder for decoding an output of the first mode selector to provide the plurality of control signals.

6. The semiconductor memory device as recited in claim 5, wherein the mode generator controls a level of a output signal to be logic high by activating a reset signal for initialization upon a power-up operation.

7. The semiconductor memory device as recited in claim 5, wherein the first mode selector selects the level decided by the metal option as a output signal in a state that the fuse is not cut and the test mode setting signal is inactivated.

8. The semiconductor memory device as recited in claim 5, wherein the first mode selector selects the output of the mode generator regardless of the metal option when the fuse is cut or the test mode setting signal is activated.

9. The semiconductor memory device as recited in claim 2, wherein the control signal generator includes:
    a pulse generator for generating the pulse signal based on the write/read command signal and an internal Column Address Strobe signal (ICASP); and a first mode delay unit for delaying the pulse signal depending on a selective activation of the plurality of control signals to provide the bank control signal.

10. The semiconductor memory device as recited in claim 9, wherein the pulse generator includes a first logic element for logically combining an inverted signal of the write command signal, an inverted signal of the read command signal and an inverted signal of the ICASP.

11. The semiconductor memory device as recited in claim 9, wherein the first mode delay unit is provided with a plurality of NAND gates connected in series, a number of NAND gates to be activated being controlled differently depending on the plurality of control signals, to thereby provide the bank control signal with different delay time.

12. The semiconductor memory device as recited in claim 11, wherein the first mode delay unit outputs the bank control signal with a first delay time upon activation of a first control signal that is a default value of the plurality of control signals, the delay time of the bank control signal being increased or decreased compared with the first delay time depending on a selective activation of a remaining control signals.

13. The semiconductor memory device as recited in claim 11, wherein the first mode delay unit is reset upon activation of a second control signal among the plurality of control signals to thereby inactivate the bank control signal.

14. The semiconductor memory device as recited in claim 2, wherein the column address enable controller includes:
a column address enable signal generator for generating the column address enable signal in response to the write/read command signal and the internal Column Address Strobe signal (ICASP);
a column address enable signal delay unit for delaying the column address enable signal for a preset time;
a second mode delay unit for delaying the column address enable signal depending on a selective activation of the plurality of control signals;
a second mode selector for selectively outputting one of an output of the column address enable signal delay unit and an output of the second mode delay unit as a mode selection signal; and
a column address enable signal decoder for decoding an output of the second mode selector.

15. The semiconductor memory device as recited in claim 14, wherein the second mode delay unit is provided with a plurality of NAND gates connected in series, a number of NAND gates to be activated being controlled differently depending on the plurality of control signals to thereby provide the column address enable signal with different delay time.

16. The semiconductor memory device as recited in claim 15, wherein the second mode delay unit outputs the column address enable signal with a first delay time upon activation of a first control signal that is a default value of the plurality of control signals, a delay time of the column address enable signal being increased or decreased compared with the first delay time depending on a selective activation of the remaining control signals.

17. The semiconductor memory device as recited in claim 15, wherein the second mode delay unit is reset upon activation of the second control signal among the plurality of control signals to thereby inactivate the column address enable signal.

18. The semiconductor memory device as recited in claim 17, wherein the second mode delay unit includes:
a second logic element for logically combining an output of the second mode delay unit and an inverted signal of the second control signal;
a third logic element for logically combining the second control signal and an output of the column address enable signal delay unit; and
a fourth logic element for logically combining outputs of the second and the third logic elements to provide the mode selection signal.

19. The semiconductor memory device as recited in claim 18, wherein each of the second to fourth logic elements includes an NAND gate.

20. A semiconductor memory device comprising:
a bank column address controller for decoding a bank address and a bank control signal to provide a bank column addresses;
an enable controller for outputting a plurality of control signals with different states in response to a test mode signal, outputting the bank control signal of which enable delay time is controlled by a selective activation state of the plurality of control signals, and controlling an access enable time of cell data to have a same delay time as the bank control signal; and
a bank for controlling an access operation of the cell data depending on the bank column address in a read/write operation mode.

21. The semiconductor memory device as recited in claim 20, further comprising a column address latch for latching the bank column addresses and outputting a latched bank column address to the bank.

22. The semiconductor memory device as recited in claim 20, wherein the enable controller includes:
a mode controller for selectively activating the plurality of control signals with different states in response to the test mode signal;
a control signal generator for taking a pulse signal generated in response to a read/write command signal and delaying the pulse signal for a predetermined time depending on a selective activation of the plurality of control signals to output the bank control signal; and
a column address enable controller for delaying a column address enable signal generated in response to the read/write command signal for a predetermined time depending on a selective activation of the plurality of control signals.

23. The semiconductor memory device as recited in claim 22, wherein the mode controller includes:
a mode generator for outputting a signal with different state based on a cutting state of fuse, a logic level of the output signal being decided depending on a state of the test signal, regardless of the cutting state of the fuse, upon activation of the test mode setting signal;
a first mode selector for selectively providing one of an output of the mode generator and a signal by the metal option; and
a mode decoder for decoding an output of the first mode selector to provide the plurality of control signals.

24. The semiconductor memory device as recited in claim 22, wherein the control signal generator includes:
a pulse generator for generating the pulse signal based on the write/read command signal and an internal Column Address Strobe signal (ICASP); and
a first mode delay unit for delaying the pulse signal depending on a selective activation of the plurality of control signals to provide the bank control signal.

25. The semiconductor memory device as recited in claim 22, wherein the column address enable controller includes:
a column address enable signal generator for generating the column address enable signal in response to the write/read command signal and the internal Column Address Strobe signal(ICASP);

a column address enable signal delay unit for delaying the column address enable signal for a preset time;

a second mode delay unit for delaying the column address enable signal depending on a selective activation of the plurality of control signals;

a second mode selector for selectively outputting one of an output of the column address enable signal delay unit and an output of the second mode delay unit as a mode selection signal; and a column address enable signal decoder for decoding an output of the second mode selector.

* * * * *